(12) United States Patent
Adachi et al.

(10) Patent No.: US 9,112,518 B2
(45) Date of Patent: Aug. 18, 2015

(54) HEATER SUBSTRATE, ALKALI METAL CELL UNIT AND ATOMIC OSCILLATOR

(71) Applicants: Kazuhiko Adachi, Miyagi (JP); Kazuhiro Harasaka, Miyagi (JP); Shunichi Sato, Miyagi (JP)

(72) Inventors: Kazuhiko Adachi, Miyagi (JP); Kazuhiro Harasaka, Miyagi (JP); Shunichi Sato, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/452,648

(22) Filed: Aug. 6, 2014

(65) Prior Publication Data
US 2015/0054591 A1    Feb. 26, 2015

(30) Foreign Application Priority Data

Aug. 20, 2013  (JP) ................................. 2013-170552
Jun. 12, 2014  (JP) ................................. 2014-121562

(51) Int. Cl.
*H03L 7/26* (2006.01)
*G04F 5/14* (2006.01)
*H05B 3/26* (2006.01)

(52) U.S. Cl.
CPC *H03L 7/26* (2013.01); *G04F 5/145* (2013.01); *H05B 3/26* (2013.01); *H05B 2203/002* (2013.01); *H05B 2203/007* (2013.01); *H05B 2203/013* (2013.01)

(58) Field of Classification Search
CPC ............. G04F 5/14; G04F 5/145; H03L 7/26; H01S 1/06; H05B 1/0227; H05B 3/0014; H05B 3/026; H05B 3/20; H05B 3/26; H05B 3/84; H05B 2203/002; H05B 2203/007; H05B 2203/008; H05B 2203/022; H05B 2203/013

USPC ............. 331/94.1, 3; 219/201, 209, 385, 552, 219/547
See application file for complete search history.

(56) References Cited

U.S. PATENT DOCUMENTS 6,570,459 B1 *  5/2003  Nathanson et al. .......... 331/94.1
6,806,784 B2   10/2004  Hollberg et al.
8,067,990 B2   11/2011  Chindo et al.
(Continued)

FOREIGN PATENT DOCUMENTS

JP    H09-064735    3/1997
JP    2009-212416   9/2009
(Continued)

OTHER PUBLICATIONS

Svenja Knappe et al. "A microfabricated atomic clock" Applied Physics Letters, vol. 85, No. 9, pp. 1460-1462(2004).
Svenja Knappe, "3.18 MEMS Atomic Clocks" Comprehensive Microsysems, vol. 3, pp. 571-612.

*Primary Examiner* — Ryan Johnson
(74) *Attorney, Agent, or Firm* — Cooper & Dunham LLP

(57) ABSTRACT

A heater substrate for heating an alkali metal cell including an alkali metal includes a first heater wiring formed in a region surrounding an alkali metal encapsulating part in which the alkali metal is encapsulated; a second heater wiring formed in the region surrounding the alkali metal encapsulating part and inside the first heater wiring; and a third heater wiring formed outside the first heater wiring. A first electric current flowing in the first heater wiring is divided into a second electric current flowing in the second heater wiring and a third electric current flowing in the third heater wiring. A direction of the first electric current is opposite to a direction of the second electric current and a direction of the third electric current.

10 Claims, 20 Drawing Sheets

(56) References Cited

U.S. PATENT DOCUMENTS

| | | |
|---|---|---|
| 8,138,760 B2 | 3/2012 | Bulatowicz |
| 8,319,156 B2 * | 11/2012 | Borwick et al. ............... 219/482 |
| 8,614,605 B2 | 12/2013 | Chindo |
| 8,633,773 B2 | 1/2014 | Chindo |
| 8,736,386 B2 | 5/2014 | Chindo |
| 2004/0026411 A1 * | 2/2004 | Mucke et al. ................. 219/543 |
| 2005/0007118 A1 | 1/2005 | Kitching et al. |
| 2012/0235754 A1 * | 9/2012 | Chindo ........................ 331/94.1 |
| 2012/0235755 A1 * | 9/2012 | Chindo ........................ 331/94.1 |
| 2014/0070894 A1 * | 3/2014 | Chindo et al. ............... 331/94.1 |

FOREIGN PATENT DOCUMENTS

| | | |
|---|---|---|
| JP | 2009-283526 | 12/2009 |
| JP | 2010-028794 | 2/2010 |
| JP | 2010-071973 | 4/2010 |
| JP | 2012-191138 | 10/2012 |
| JP | 2012-191582 | 10/2012 |
| JP | 2013-030513 | 2/2013 |
| JP | 2013-058563 | 3/2013 |

* cited by examiner

HEATER SUBSTRATE, ALKALI METAL CELL UNIT AND ATOMIC OSCILLATOR

BACKGROUND OF THE INVENTION

1. Field of the Invention

The disclosures herein generally relate to a heater substrate, an alkali metal cell unit and an atomic oscillator.

2. Description of the Related Art

An atomic clock (an atomic oscillator) is an extremely accurate clock. Technologies for reducing the size of the atomic clock are being studied. The atomic clock is an oscillator based on transition energy of an electron included in an atom of alkali metal or the like. Especially, electron transition energy of an alkali metal atom is found to be quite accurate if the process is not influenced by any disturbance. Accordingly, stability of frequency, which has been improved by more than several orders of magnitude compared with a crystal oscillator, can be obtained.

There have been several types of atomic oscillators. Among such atomic oscillators, a CPT (Coherent Population Trapping) type atomic oscillator provides stability of frequency, precision of which is higher by three orders of magnitude than that of the crystal oscillator of the related art. Furthermore, it is hoped that size and power consumption of the CPT type atomic oscillator can be reduced (See for example, Appl. Phys. Lett. Vol. 85, pp. 1460-1462 (2004) and Comprehensive Microsystems, Vol. 3, pp. 571-612).

The CPT type atomic oscillator includes, as shown in FIG. 1, a light source 910 such as a laser element, an alkali metal cell 940 in which alkali metals are encapsulated, and a light detector 950 which receives a laser light that passes through the alkali metal cell 940. The laser light is modulated, and by sideband wavelengths appearing on both sides of a carrier wave which are specific wavelengths, excites electrons in alkali metal atoms with two simultaneous transitions of the electrons. Transition energy of the above transition is constant. When the sideband wavelength coincides with a wavelength corresponding to the transition energy, a transparency phenomenon that absorption of light by the alkali metal decreases occurs. In this way, the CPT type atomic oscillator is an atomic oscillator having a feature that while a wavelength of the carrier wave is adjusted so that the absorption of light by the atomic metal decreases, a signal detected by the light detector 950 is fed back to a modulator 960, and a modulation frequency of the laser light from the light source 910 such as a laser element is adjusted by the modulator 960. Meanwhile, the laser light is emitted from the light source 910 and is transmitted onto the alkali metal cell 940 via a collimator lens 920 and a λ/4 plate 930.

A manufacturing method for the alkali metal cell in the above-described compact atomic oscillator by using a MEMS (Micro Electro Mechanical Systems) technique is disclosed (U.S. Pat. No. 6,806,784, US Patent Application Publication No. 2005/0007118, Japanese Published Patent Applications No. 2009-212416, and 2009-283526). In the method disclosed in them, at first, an aperture is formed in a silicon (Si) substrate by using a photolithography technique and an etching technique, and then the Si substrate is bonded to a glass plate by an anodic bonding. The anodic bonding is performed at a temperature of from 200 to 400° C., applying voltage of about from 250 to 1000 V to an interface between the glass and the Si substrate. Afterward, an alkali metal and buffer gas are input, and the cell is sealed by binding the glass to an aperture part which is a top side by the anodic bonding. By cutting out what is formed in this way for each cell, an alkali metal cell is formed.

The alkali metal cell, as described above, is also called an alkali metal gas cell. In order to make the sealed alkali metal and buffer gas be in the form of gas, the gas cell is heated to the predetermined temperature. For example, a heat body configured with a transparent conductive film such as Indium Tin Oxide (ITO) is provided on a surface of an alkali metal cell in an atomic oscillator. An electric current is applied to the heat body to make the heat body produce heat. In this way, the alkali metal cell with the heat body provided on the alkali metal cell may be called in the present application an alkali metal cell unit.

The atomic oscillator is constantly controlled by feedback so that temperature in the alkali metal cell is kept constant. Therefore, when outside temperature changes, the current flowing through the heat body is also changed. In this way, when the current flowing through the heat body changes, a magnetic field generated by the heat body also changes. The generated magnetic field raises a problem in that a frequency corresponding to an energy difference between ground levels of a metallic atom in the alkali metal cell varies and an output frequency may be shifted. Accordingly, it is desirable that an unnecessary magnetic field generated by a heater be suppressed as much as possible in the atomic oscillator.

As a technique of eliminating such an unnecessary magnetic field generated by a heater, Japanese Published Patent Application No. 2012-191138 discloses a method of forming a heater having a meandering pattern of ITO or the like. Moreover, Japanese Published Patent Application No. 2010-71973 discloses a method of forming a heater having a winding pattern of a metallic material or the like.

In the methods disclosed in Japanese Published Patent Applications No. 2012-191138 and No. 2010-71973, a wiring is formed in the meandering pattern or the winding pattern. Directions of electric currents flowing in adjacent wirings are opposite to each other, and opposing generated magnetic fields cancel out each other, so that the effective magnetic field is weakened. In the method disclosed in Japanese Published Patent Application No. 2012-191138, it is necessary to use a transparent conducting material with a high resistance, and a range of choice of a material for forming the heater is narrow. On the other hand, in the method disclosed in Japanese Published Patent Application No. 2010-71973, for the material forming the heater, a metallic material with a low resistance can be used.

High accuracy is required for the atomic oscillator, and the weaker the magnetic field generated by applying a current to the heater is, the more desirable it is. However, in the method described in Japanese Published Patent Application No. 2010-71973, the magnetic field generated by applying current to the heater has a lower limit, and the magnetic field cannot be made sufficiently weak.

SUMMARY OF THE INVENTION

It is a general object of at least one embodiment of the present invention to provide a heater substrate, an alkali metal cell unit and an atomic oscillator that substantially obviate one or more problems caused by the limitations and disadvantage of the related art.

In one embodiment, a heater substrate for heating an alkali metal cell including an alkali metal includes a first heater wiring formed in a region surrounding an alkali metal encapsulating part in which the alkali metal is encapsulated; a second heater wiring formed in the region surrounding the alkali metal encapsulating part and inside the first heater wiring; and a third heater wiring formed outside the first heater wiring. An electric current flowing in the first heater wiring is divided into an electric current flowing in the second heater wiring and an electric current flowing in the third heater wiring. A direction of the electric current flowing in the first heater wiring is opposite to a direction of the electric current flowing in the second heater wiring and a direction of the electric current flowing in the third heater wiring.

In another embodiment, an alkali metal cell unit includes a heater substrate and an alkali metal cell. The heater substrate for heating the alkali metal cell including an alkali metal includes a first heater wiring formed in a region surrounding an alkali metal encapsulating part in which the alkali metal is encapsulated; a second heater wiring formed in the region surrounding the alkali metal encapsulating part and inside the first heater wiring; and a third heater wiring formed outside the first heater wiring. An electric current flowing in the first heater wiring is divided into an electric current flowing in the second heater wiring and an electric current flowing in the third heater wiring. A direction of the electric current flowing in the first heater wiring is opposite to a direction of the electric current flowing in the second heater wiring and a direction of the electric current flowing in the third heater wiring. The alkali metal cell includes a substrate in which an aperture penetrating from a first side to a second side is formed; a first transparent substrate bonded to the first side of the substrate; and a second transparent substrate bonded to the second side of the substrate. The alkali metal is encapsulated in a space enclosed by the first transparent substrate and the second transparent substrate in the aperture of the substrate, to form the alkali metal encapsulating part. The heater substrate is provided on the first transparent substrate or on the second transparent substrate.

In yet another embodiment, an atomic oscillator includes an alkali metal cell unit; a light source that emits laser light on an alkali metal encapsulating part in the alkali metal cell unit; and a light detection unit that detects light transmitted through the alkali metal encapsulating part in the alkali metal cell unit of the laser light emitted on the alkali metal encapsulating part in the alkali metal cell unit. The alkali metal cell unit includes a heater substrate and an alkali metal cell. The heater substrate for heating the alkali metal cell including an alkali metal includes a first heater wiring formed in a region surrounding an alkali metal encapsulating part in which the alkali metal is encapsulated; a second heater wiring formed in the region surrounding the alkali metal encapsulating part and inside the first heater wiring; and a third heater wiring formed outside the first heater wiring. An electric current flowing in the first heater wiring is divided into an electric current flowing in the second heater wiring and an electric current flowing in the third heater wiring. A direction of the electric current flowing in the first heater wiring is opposite to a direction of the electric current flowing in the second heater wiring and a direction of the electric current flowing in the third heater wiring. The alkali metal cell includes a substrate in which an aperture penetrating from a first side to a second side is formed; a first transparent substrate bonded to the first side of the substrate; and a second transparent substrate bonded to the second side of the substrate. The alkali metal is encapsulated in a space enclosed by the first transparent substrate and the second transparent substrate in the aperture of the substrate, to form the alkali metal encapsulating part. The heater substrate is provided on the first transparent substrate or on the second transparent substrate.

According to the present invention, a heater substrate is provided in which a magnetic field generated by applying a current to the heater is weak.

BRIEF DESCRIPTION OF THE DRAWINGS

Other objects and further features of embodiments will be apparent from the following detailed description when read in conjunction with the accompanying drawings, in which.

DESCRIPTION OF THE PREFERRED EMBODIMENTS

Figure 1:
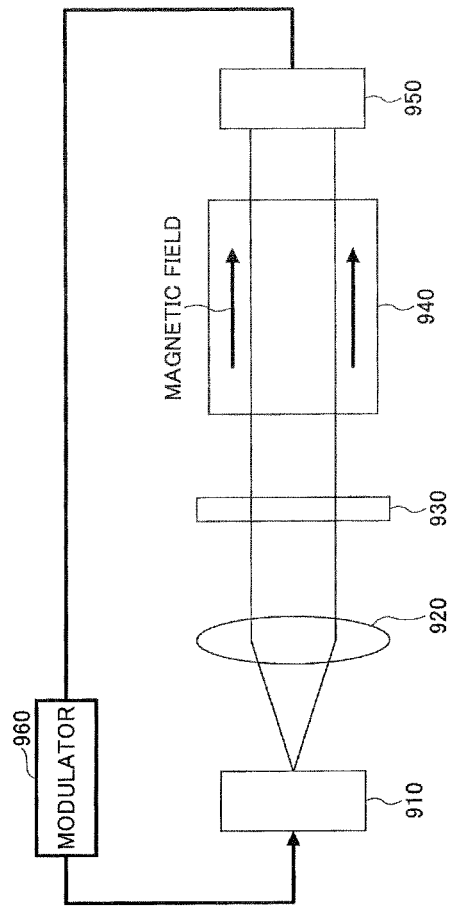
FIG. 1 is an explanatory diagram illustrating an example of an atomic oscillator according to a first embodiment.

In the following, embodiments of the present invention will be described with reference to the accompanying drawings. Meanwhile, to the same members or the like, the same reference numerals are assigned and duplicate explanation is omitted.

First Embodiment

At first, it will be explained that there is a limit on reduction of a magnetic field generated by applying current to a heater according to the method described in Japanese Published Patent Application No. 2010-71973.

Figure 2:
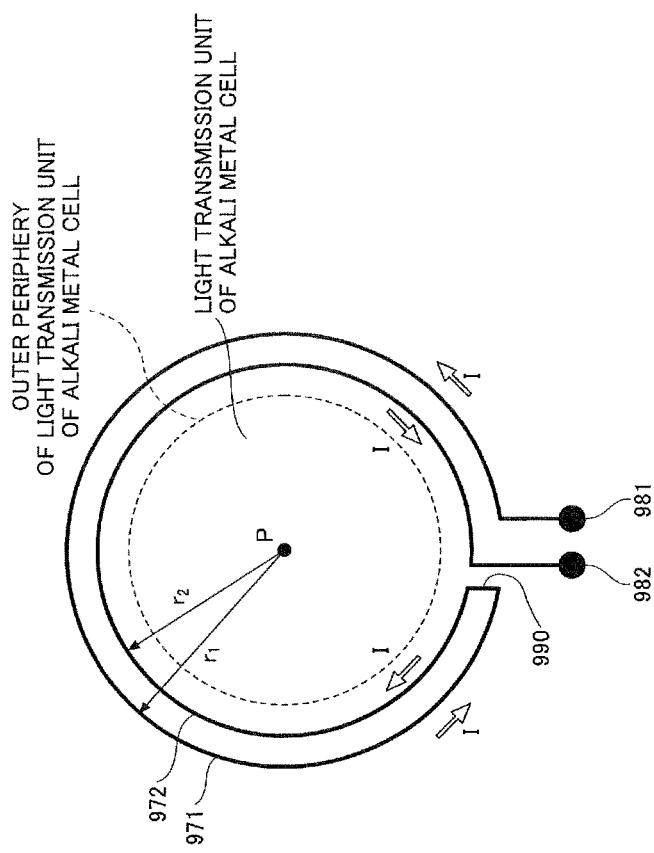
FIG. 2 is a first configuration diagram illustrating an example of a heater in an alkali metal cell unit of a related art.

A heater having a configuration as shown in FIG. 2 is arranged on an alkali metal cell unit, in which a first heater wiring 971 and a second heater wiring 972 inside the first heater wiring 971 are formed. The first heater wiring 971 and the second heater wiring 972 are formed around a light transmission unit of the alkali metal cell in approximately circular shapes with a center at a central point P of the heater. Specifically, a core of the first heater wiring 971 is arranged on a circumference of a circle with a radius $r_1$ and a center at the central point P of the heater, and a core of the second heater wiring 972 is arranged on a circumference of a circle with a radius $r_2$ and a center at the central point P of the heater.

To one end of the first heater wiring 971 a first electrode terminal 981 is connected and to one end of the second heater wiring 972 a second electrode terminal 982 is connected. Another end of the first heater wiring 971 and another end of the second heater wiring 972 are connected at a heater connection part 990. Meanwhile, the first heater wiring 971, the second heater wiring 972 and the heater connection part 990 are formed of the same conductive material, e.g. a carbon paste having a thickness of about 20.2 µm. Moreover, the first electrode terminal 981 and the second electrode terminal 982 are formed of a silver paste having a thickness of about 28.4 µm. Moreover, the first electrode terminal 981 and the second electrode terminal 982 are connected to a power supply, which is not shown.

In the following, assume that in the heater having the configuration as shown in FIG. 2, the first electrode terminal 981 is connected to a positive terminal of the power supply, which is not shown, and the second electrode terminal 982 is connected to a negative terminal of the power supply. In this case, an electric current flows through the first heater wiring 971 from the first electrode terminal 981 round-about in the counter-clockwise direction, flows through the heater connection part 990, and flows into the second heater wiring 972 arranged inside the first heater wiring 971. Through the second heater wiring 972, the electric current flows round-about in the clockwise direction and flows to the second electrode terminal 982.

Here, at a point where a distance from the first heater wiring 971 is the same as a distance from the second heater wiring 972, a magnetic field generated by a current flowing in the first heater wiring 971 and a magnetic field generated by a current flowing in the second heater wiring 972 cancel each other. On the other hand, in the case where the distance from the first heater wiring 971 is different from the distance from the second heater wiring 972, the magnetic the magnetic field generated by a current flowing in the first heater wiring 971 and the magnetic field generated by a current flowing in the second heater wiring 972 do not cancel each other completely.

For example, the magnetic field at the central point P of the heater will be considered. The distance from the first heater wiring 971 is the radius $r_1$, the distance from the second heater wiring 972 is the radius $r_2$, and the first heater wiring 971 is outside the second heater wiring 972, then $r_1 > r_2$. Moreover, since the electric current I flowing through the first heater wiring 971 is the same as the electric current I flowing through the second heater wiring 972, at the central point P of the heater, an influence of the magnetic field generated by the electric current flowing through the second heater wiring 972 having a shorter radius $r_2$ is stronger. That is, the magnetic field generated by the electric current flowing through the second heater wiring 972 is stronger than the magnetic field generated by the electric current flowing through the first heater wiring 971. Accordingly, of the magnetic field generated by the electric current flowing through the second heater wiring 972, a part of the magnetic field that cannot be cancelled remains. Such remaining magnetic field affects the alkali metal cell.

Accordingly, in the alkali metal cell unit having a configuration in which a heater is provided, a magnetic field, a value of which is quite a small i.e. nearly zero, at the central point P of the heater is desired.

Explaining in more detail, the heater having the configuration as shown in FIG. 2 is provided with the first heater wiring 971 and the second heater wiring 972 around the light transmission unit of the alkali metal cell which is not shown. By passing an electric current I through the first heater wiring 971 and through the second heater wiring 972, directions of the electric currents are opposite to each other, and magnetic fields generated by the electric currents cancel each other.

Here, assume in the following explanation that around the light transmission part of the alkali metal cell, the first heater wiring 971 and the second heater wiring 972 having a diameter of about 3 mm. Meanwhile, here, the diameter of the first heater wiring 971 is assumed to be comparable with that of the second heater wiring 972. Moreover, a wiring width of the first heater wiring 971 and the second heater wiring 972 is 50 µm, a thickness of wiring is 2 µm, and the electric power required for the alkali metal cell is 100 mW. In this case, the first heater wiring 971 and the second heater wiring 972 are formed of ITO ($\rho = 1.48 \times 10^{-4}$ Ω·cm). A resistance of the entire heater is 279Ω. The electric power supplied when the power supply voltage is 5 V is estimated to be about 90 mW, which is not sufficient for the required value, i.e. 100 mW.

On the other hand, in the case where the first heater wiring 971 and the second heater wiring 972 are formed of platinum ($\rho = 1.02 \times 10^{-5}$ Ω·cm), the resistance of the entire heater is 19Ω. The electric power supplied when the power supply voltage is 5 V is estimated to be 1300 mW. Accordingly, a sufficient amount of electric power greater than the required value, i.e. 100 mW, can be supplied.

As described above, for the material from which the first heater wiring 971 and the second heater wiring 972 are formed, a metallic material is preferable. The metallic material has a low resistivity, by which electric power supply capacity can be enhanced, and the power supply voltage can be lowered. Furthermore, the metallic material can be worked easily and a degree of freedom of design is high.

As in the heater including the first heater wiring 971 and the second heater wiring 972, magnetic flux density at a center in an air core coil pattern can be obtained according to the following formula 1, where $\mu_0$ is magnetic permeability in a vacuum, r is a radius and I is an electric current.

$$B = \mu_0 I / 2\pi r \qquad \text{[Formula 1]}$$

As shown in Formula 1, in a winding pattern on a plane having a configuration as shown in FIG. 2, actually, a distance from the central point P of the heater, i.e. a radius, which is a distance from a center of the alkali metal cell, is different for each winding. That is, the radius $r_2$ for the second heater wiring 972 is smaller than the radius $r_1$ for the first heater wiring 971, i.e. $r_1 > r_2$.

Accordingly, even if an electric current flows through the first heater wiring 971 and through the second heater wiring 972, adjacent to each other, where directions of the current are opposite to each other, the magnetic field B at the center of the alkali metal cell cannot be made zero completely.

Meanwhile, as disclosed in Japanese Published Patent Application No. 2012-191138, in the configuration of a heater in the related art, in which a whole surface of an alkali metal cell is covered, for a material of heater wirings, ITO is generally used, since a material which can pass light is required. However, since ITO is hard and brittle, ITO has a manufacturing restriction, e.g. disconnection may occur when it is bent. A resistivity may vary due to a manufacturing condition. Furthermore, the resistivity is higher than that of a metal. Accordingly, a degree of design freedom of a heater is low.

Moreover, in the winding type, an opaque metallic wiring can be used. However, as described above, since respective formed wirings are different in distance from a center, a density of magnetic flux at a center of an alkali metal cell cannot be cancelled completely.

The present embodiment provides a heater substrate, in which a heater wiring is formed of a metallic material or the like and a magnetic field generated by an electric current flowing can be made quite small, and an alkali metal cell unit having the heater substrate.

(Heater Substrate Provided in Alkali Metal Cell Unit)

Next, with reference to FIG. 3, a heater substrate provided in an alkali metal cell unit according to the present embodiment will be explained.

On the heater substrate provided in the alkali metal cell unit according to the present embodiment, a second heater wiring 12 is formed inside the first heater wirings 11a and 11b, and a third heater wiring 13 is formed outside the first heater wirings 11a and 11b. The first heater wirings 11a, 11b, the second heater wiring 12, and third heater wiring 13 are formed concentrically with centers at the central point P of the heater. Meanwhile, the first heater wirings 11a, 11b, the second heater wiring 12 and the third heater wiring 13 are formed around a region which becomes a light transmission unit of the alkali metal cell. In the present application, the light transmission unit of the alkali metal cell may be denoted an alkali metal encapsulation unit.

Specifically, cores of the first heater wirings 11a and 11b are arranged on a circumference of a circle with a radius $r_{11}$ and a center at the central point P of the heater. Moreover, a core of the second heater wiring 12 is arranged on a circumference of a circle with a radius $r_{12}$ and a center at the central point P of the heater. Moreover, a core of the third heater wiring 13 is arranged on a circumference of a circle with a radius $r_{13}$ and a center at the central point P of the heater. Meanwhile, the radius $r_{13}$ is greater than the radius $r_{11}$, and the radius $r_{12}$ is less than the radius $r_{11}$, i.e. $r_{13} > r_{11} > r_{12}$.

In the present embodiment, the first heater wirings 11a and 11b have forms of approximate semicircles, obtained by dividing an approximate circle into two parts. Each of the second heater wiring 12 and the third heater wiring 13 has a form of an approximate circle. In the present embodiment, the first heater wiring 11a may be denoted as one first heater wiring 11a, and the first heater wiring 11b may be denoted as other first heater wiring 11b.

At one end of the one first heater wiring 11a a first electrode terminal 21 is provided, and at one end of the other first heater wiring 11b a second electrode terminal 22 is provided. Moreover, at the other end of the one first heater wiring 11a a first heater connection part 31 is provided. At the first heater connection part 31, the one first heater wiring 11a is connected to one end of the second heater wiring 12 and one end of the third heater wiring 13. Moreover, at the other end of the other first heater wiring 11b a second heater connection part 32 is provided. At the second heater connection part 32, the other first heater wiring 11b is connected to the other end of the second heater wiring 12 and the other end of the third heater wiring 13.

Meanwhile, in the present embodiment, the first heater wirings 11a and 11b, the second heater wiring 12, the third heater wiring 13, the first heater connection part 31 and the second heater connection part 32 are formed of the same conductive material, e.g. a carbon paste having a thickness of about 20.2 μm. Moreover, the first electrode terminal 21 and the second electrode terminal 22 are formed of a silver paste having a thickness of about 28.4 μm.

Moreover, a connection wiring 41 connecting the one first heater wiring 11a with the first electrode terminal 21 and a connection wiring 42 connecting the other first heater wiring 11b with the second electrode terminal 22 intersect with the third heater wiring 13 at an intersection part 50. For this reason, in the present embodiment, at the intersection part 50, an insulation film, which is not shown, is provided on the third heater wiring 13. On the insulation film, which is not shown, the connection wirings 41 and 42 are formed. Accordingly, at the intersection part 50, the third heater wiring 13 and the connection wirings 41 and 42 are insulated electrically.

Consider a case where on the heater substrate provided on the alkali metal cell in the present embodiment, as shown in FIG. 2, the first electrode terminal 21 is connected to the positive terminal of the power supply, which is not shown, and the second electrode terminal 22 is connected to the negative terminal of the power supply. In this case, an electric current $I_1$ flows through the one first heater wiring 11a from the first electrode terminal 21 about a half round in the clockwise direction. At the first heater connection part 31 the electric current $I_1$ is divided into an electric current $I_2$ flowing in the second heater wiring 12 and an electric current $I_3$ flowing in the third heater wiring 13. In the second heater wiring 12, the electric current $I_2$ flows about a full round in the counter-clockwise direction. In the third heater wiring 13, the electric current $I_3$ flows about a full round in the counter-clockwise direction. At the second heater connection part 32, the electric currents $I_2$ and $I_3$ are combined to become the electric current $I_1$. The electric current $I_1$, which is formed by combining the electric currents $I_2$ and $I_3$ together at the second heater connection part 32, flows through the other first heater wiring 11b about a half round in the clockwise direction, and flows to the second electrode terminal 22.

Accordingly, a magnetic field generated by the electric current $I_1$ flowing through the first heater wirings 11a and 11b having the radius $r_{11}$ is cancelled by a magnetic field generated by the electric current $I_2$ flowing through the second heater wiring 12 having the radius $r_{12}$ and a magnetic field generated by the electric current $I_3$ flowing through the third heater wiring 13 having the radius $r_{13}$.

Here, a distance between the cores of the first heater wirings 11a and 11b having the radius $r_{13}$ and the core of the second heater wiring 12 having the radius $r_{12}$ is G1, and a distance between the cores of the first heater wirings 11a and 11b and the core of the third heater wiring 13 having the radius $r_{13}$ is G2. In this case, G1 may be equal to G2, i.e. G1-G2. Moreover, values of G1 and G2 may be set so that the magnetic field at the central point P of the heater is zero or a value which is very nearly zero. In this case, G1 may be greater than G2, i.e. G1>G2.

Moreover, in the case where G1 and G2 are approximately the same, i.e. G1-G2 or G1≈G2, $I_2$ is preferably greater than Is, i.e. $I_2>I_3$, as described later. Meanwhile, a ratio of the electric current $I_2$ flowing through the second heater wiring 12 to the electric current $I_3$ flowing through the third heater wiring 13 is adjustable by making a resistance value of the second heater wiring 12 different from a resistance value of the third heater wiring 13. Specifically, the ratio can be made adjustable by making a wiring width of the second heater wiring 12 different from a wiring width of the third heater wiring 13.

(Simulation of Magnetic Field Generated by Applying Electric Current to Heater)

Next, a result of a simulation of a magnetic field generated by an electric current flowing through a heater which is formed in an alkali metal cell unit will be explained. Specifically, simulations were done for a heater having a configuration as shown in FIG. 4, a heater having the configuration as shown in FIG. 2, and a heater used for an alkali metal cell unit according to the present embodiment as shown in FIG. 3. Meanwhile, the heater having the configuration as shown in FIG. 4 is a heater with one heater wiring, in which at one end of a heater wiring 975 having an approximately circular shape a first electrode terminal 981 is provided and at an other end a second electrode terminal 982 is provided. Therefore, it is a configuration in which an influence of the magnetic field generated by an electric current flowing through the heater wiring is not cancelled. A condition for the simulation is that a wiring width of the heater wiring is 0.8 mm and the electric current applied to the heater is 10 mA for each case.

The heater having the configuration as shown in FIG. 4 is formed so that a core of the heater wiring 975 is arranged on a circumference of a circle with a radius $r_0$ of 2.66 mm and a center at the central point P of the heater. Meanwhile, the heater wiring 975 is formed of a carbon paste having a thickness of about 20.2 μm.

Moreover, the heater having the configuration as shown in FIG. 2 is formed so that a core of the first heater wiring 971 is arranged on a circumference of a circle with a radius $r_1$ of 3.02 mm and a center at the central point P of the heater, and a core of the second heater wiring 972 is arranged on a circumference of a circle with a radius $r_2$ of 2.66 mm. Accordingly, a distance between the core of the first heater wiring 971 and the core of the second heater wiring 972 is 0.36 mm.

Figure 3:
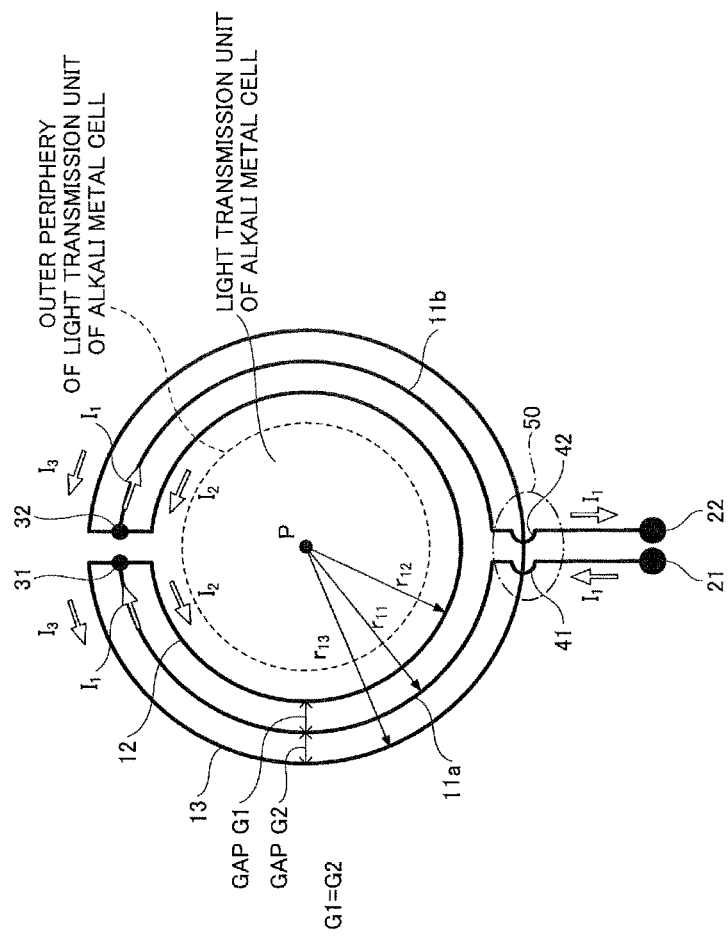
FIG. 3 is a configuration diagram illustrating an example of a heater in an alkali metal cell unit according to the first embodiment.
Figure 4:
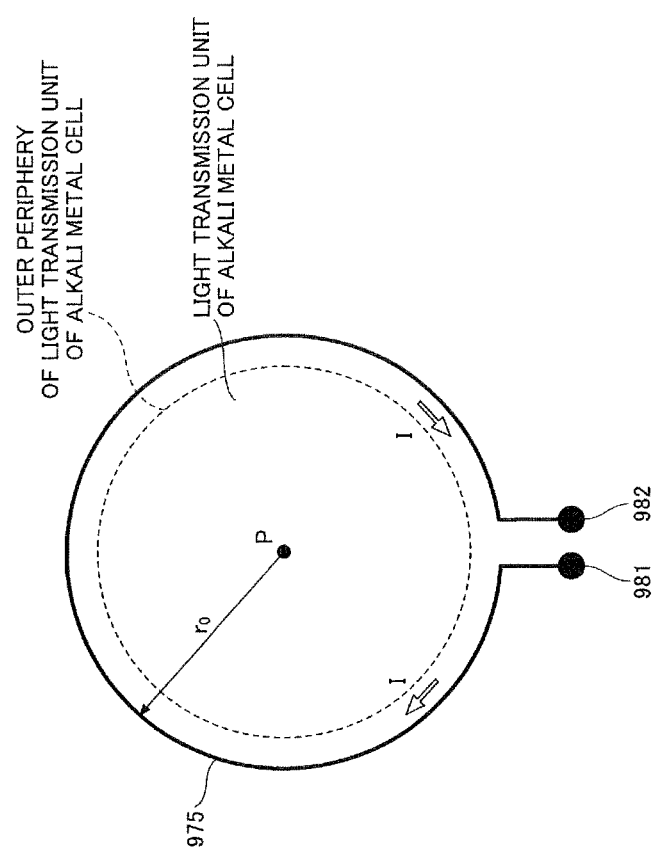
FIG. 4 is a second configuration diagram illustrating an example of the heater in the alkali metal cell unit of the related art.

Moreover, the heater according to the present embodiment having the configuration as shown in FIG. 3 is formed so that cores of the first heater wirings 11a and 11b are arranged on a circumference of a circle with a radius $r_{11}$ of 2.66 mm and a center at the central point P of the heater. Moreover, it is formed so that a core of the second heater wiring 12 is arranged on a circumference of a circle with a radius $r_{12}$ of 2.30 mm and a center at the central point P of the heater, and a core of the third heater wiring 13 is arranged on a circumference of a circle with a radius $r_{13}$ of 3.02 mm. Accordingly, a distance G1 between the cores of the first heater wirings 11a and 11b and the core of the second heater wiring 12 is 0.36 mm, and a distance G2 between the cores of the first heater wirings 11a and 11b and the core of the third heater wiring 13 is 0.36 mm.

Table 1, which is shown below, shows a density of magnetic flux B (μT) at the central point P of the heater, which is obtained by simulations. Meanwhile, a row S1 shows a result for the heater having the configuration as shown in FIG. 4. A row S2 shows a result for the heater having the configuration as shown in FIG. 2. Rows S3 and S4 show results for the heater having the configuration as shown in FIG. 3, i.e. the heater in the alkali metal cell unit according to the present embodiment. S3 indicates a case where the electric current $I_2$ and the electric current $I_3$ are almost the same, e.g. the electric current $I_2$ is 5 mA, and the electric current $I_3$ is 5 mA. S4 indicates a case where the electric current $I_2$ is 3 mA, and the electric current $I_3$ is 7 mA.

TABLE 1

|  | Heater configuration | Density of magnetic flux B at center of heater (μT) |
|---|---|---|
| S1 | Heater with only one heater wiring | 2.09 |
| S2 | Heater with first and second heater wirings ($I_1$ = 10 mA) | 1.28 |
| S3 | Heater with first, second and third heater wirings ($I_2 = I_3$ = 5 mA) | 0.34 |
| S4 | Heater with first, second and third heater wirings ($I_2$ = 3 mA, $I_3$ = 7 mA) | 0.027 |

As shown in Table 1, in the case of the heater with the configuration shown in FIG. 4, i.e. with only one heater wiring, in the row S1, the density of magnetic flux at the central point P of the heater is 2.09 (μT). Moreover, in the case of the heater with the configuration shown in FIG. 2, in the row S2, the density of magnetic flux at the central point P of the heater is 1.28 (μT). Therefore, by applying an electric current in the opposite direction, the density of magnetic flux at the central point P can be lowered to some extent, but it is not sufficient.

Moreover, regarding the heater used for the alkali metal cell according to the present embodiment, in the case of S3, the density of magnetic flux at the central point P of the heater is 0.34 (μT). Accordingly, in the heater having the configuration used for the alkali metal cell according to the present embodiment, the density of magnetic flux at the central point P of the heater is about one fourth of that in the heater in the case of S2. Furthermore, in the case of S4, the density of magnetic flux at the central point P of the heater is 0.027 (μT). On the heater substrate according to the present embodiment, as in the case of S4, by applying the electric currents $I_2$ of 3 mA and $I_3$ of 7 mA, the density of magnetic flux can be reduced down to one fiftieth. Accordingly, as described above, in the case where the distances G1 and G2 are almost the same (i.e. G1-G2 or G1≈G2), by adjusting the electric currents so that $I_3$ is greater than $I_2$, i.e. $I_2<I_3$, the density of magnetic flux at the central point P of the heater can be made quite small.

(Manufacturing Method of Alkali Metal Cell Unit)

Next, a manufacturing method of an alkali metal cell unit according to the present embodiment will be explained.

Figure 5A:
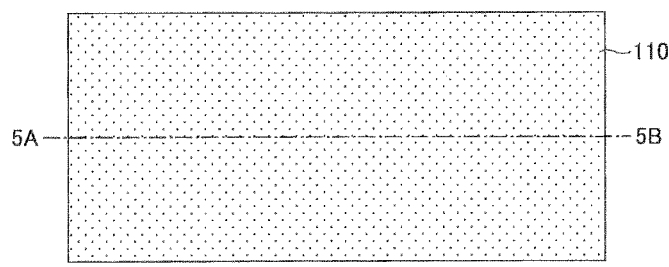
FIGS. 5A and 5B are first process diagrams illustrating an example of a manufacturing method of the alkali metal cell unit according to the first embodiment.
Figure 5B:
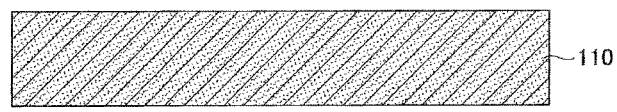

At first, as shown in FIGS. 5A and 5B, a silicon (Si) substrate 110 is prepared. A thickness of the Si substrate 110 is 1.5 mm. Both sides of the Si substrate 110 are processed by mirror finishing. Meanwhile, FIG. 5A is a top view in this process, and FIG. 5B shows a cross-sectional view cut along a dot-dashed line 5A-5B in FIG. 5A.

Figure 6A:
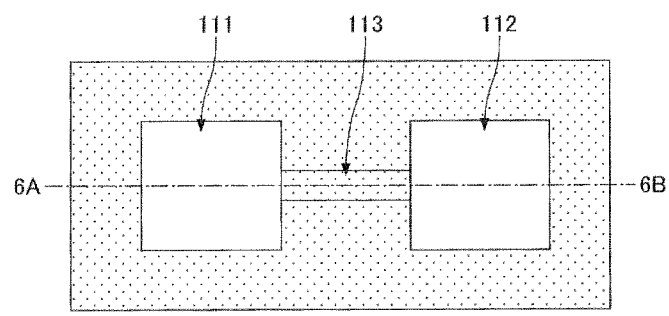
FIGS. 6A and 6B are second process diagrams illustrating an example of the manufacturing method of the alkali metal cell unit according to the first embodiment.
Figure 6B:
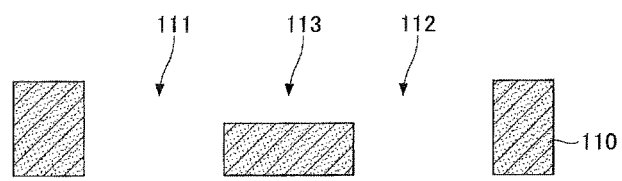

Next, as shown in FIGS. 6A and 6B, a first aperture 111, a second aperture 112 and a groove section 113 which connects the first aperture 111 and the second aperture 112 are formed in the Si substrate 110. Meanwhile, FIG. 6A is a top view in this process and FIG. 6B shows a cross-sectional view cut along a dot-dashed line 6A-6B in FIG. 6A.

Specifically, a photoresist is applied on one side of the Si substrate 110, an exposure is performed using an exposure device and a developing is performed, thereby a resist pattern, which is not shown, is formed, the resist pattern having an opening in a region where the first aperture 111, the second aperture 112 and the groove section are formed. After this, by a dry etching such as an ICP (Inductively Coupled Plasma) for the Si substrate 110 Si in a region where the resist pattern is not formed is removed, and a recessed portion a depth of which is about a half of the thickness of the Si substrate 110 is formed.

Next, the photoresist is applied on the other side of the Si substrate 110, an exposure is performed using an exposure device and a developing is performed; thereby a resist pattern, which is not shown, is formed, the resist pattern having an opening in a region where the first aperture 111 and the second aperture 112 are formed. After this, by dry etching such as the ICP for the Si substrate 110, Si in a region where the resist pattern is not formed is removed, and the first aperture 111 and the second aperture 112 that penetrate the Si substrate 110 are formed.

In the present embodiment, the groove section 113 does not penetrate the Si substrate 110, since only one side of the Si substrate 110 is etched. The dry etching for silicon is performed by the Bosch process in which $SF_6$ and $C_4F_8$ are alternately provided. By the Bosch process, an etching with high anisotropy for Si can be performed at high speed. Meanwhile, for this dry etching, applied electric power is 2 kW.

The method of forming the first aperture 111 and the second aperture 112 by dry etching is explained above. The first aperture 111 and the second aperture 112 may be formed by wet etching. Specifically, at first, a SiN film, which is not shown, is formed on each side of the Si substrate 110 by decompression CVD (Chemical Vapor Deposition). On the formed SiN film, a photoresist is applied, an exposure is performed using the exposure device and a developing is performed; thereby the resist pattern, which is not shown, is formed, the resist pattern having an opening in a region where the first aperture 111, the second aperture 112 and the groove section are formed on one side. In the same way, on the other side, a resist pattern, which is not shown, is formed having an opening in a region where the first aperture 111 and the second aperture 112 are formed. After this, by performing dry etching using $CF_4$ as an etching gas, a SiN film in a region where the resist pattern is not formed is removed. Furthermore, by removing the resist pattern, a mask including SiN is formed. After this, at temperature of 85° C., by performing a wet etching using a potassium hydroxide (KOH) solution of 30 wt %, Si in a region where the mask including SiN is not formed is removed, thereby the first aperture 111, the second aperture 112 and the groove section are formed in the Si substrate 110. Furthermore, after this, the mask including SiN is removed by wet etching or the like by using a solution that dissolves SiN. Meanwhile, the wet etching for Si is an anisotropic etching, and on the side surface of the formed first aperture 111, the second aperture 112 and the groove section 113, reverse slopes are formed with an angle of slope 54.7°.

Figure 7A:
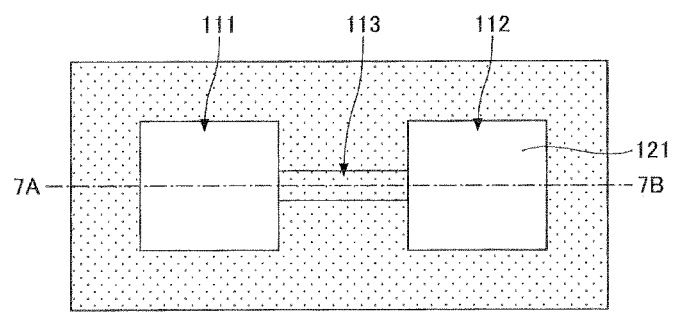
FIGS. 7A and 7B are third process diagrams illustrating an example of the manufacturing method of the alkali metal cell unit according to the first embodiment.
Figure 7B:
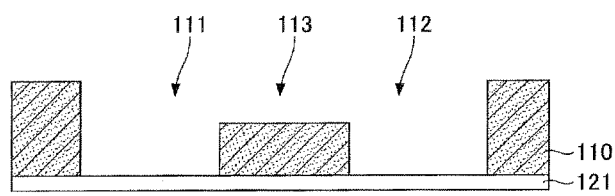

Next, as shown in FIGS. 7A and 7B, a first glass substrate 121, which will be a first transparent substrate, is attached to the Si substrate 110 in which the first aperture 111, the second aperture 112 and the groove section 113 are formed on the side where the groove section 113 is not formed, i.e. the other side of the Si substrate 110, by anode bonding. Meanwhile, FIG. 7A is a top view in this process, and FIG. 7B shows a cross-sectional view cut along a dot-dashed line 7A-7B in FIG. 7A.

Specifically, in a decompression chamber, the first glass substrate 121 is brought into contact with the Si substrate 110 on the side where the groove section 113 is not formed, i.e. the other side of the Si substrate 110, and a voltage of −800 V is applied to the first glass substrate 121 at the temperature of 380° C., and thereby anode bonding is performed. Since in this case an alkali metal raw material or the like is not placed, the alkali metal is not oxidized by oxygen or the like generated in the anode bonding.

Figure 8A:
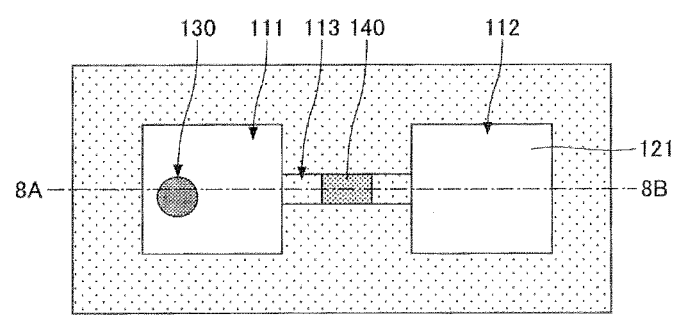
FIGS. 8A and 8B are fourth process diagrams illustrating an example of the manufacturing method of the alkali metal cell unit according to the first embodiment.
Figure 8B:
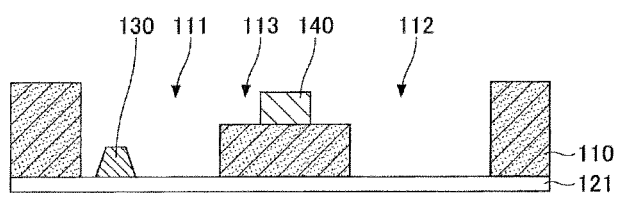

Next, as shown in FIGS. 8A and 8B, an alkali metal raw material 130 such as cesium Cs or Rubidium Rb is injected in the first aperture 111 of the Si substrate 110. Furthermore, a junction metal raw material 140 to fill the groove section 113 is placed in the groove section 113. The junction metal raw material 140 is a material that does not melt at a temperature provided by a heater, but melts at a temperature higher than the temperature provided by the heater but at a relatively low temperature. The junction metal raw material 140 fills the groove section 113 by melting. Moreover, in the present embodiment, the first aperture 111 where the alkali metal raw material is placed may be denoted as a raw material chamber. Meanwhile, FIG. 8A is a top view in this process, and FIG. 8B shows a cross-sectional view cut along a dot-dashed line 8A-8B in FIG. 8A.

Figure 9A:
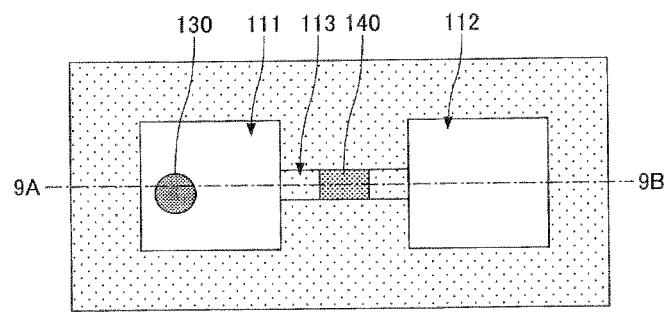
FIGS. 9A and 9B are fifth process diagrams illustrating an example of the manufacturing method of the alkali metal cell unit according to the first embodiment.
Figure 9B:
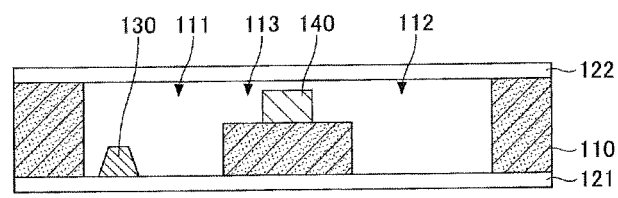

Next, as shown in FIGS. 9A and 9B, nitrogen, which will be a buffer gas, is introduced in a vacuum chamber and a nitrogen atmosphere is prepared. In the nitrogen atmosphere, a second glass substrate 122, which will be a second transparent substrate, is placed on one side of the Si substrate 110. After this, the second glass substrate 122 is attached to the Si substrate 110 by anodic bonding. In this case, in the groove section 113 the junction metal raw material 140 is placed, but in this stage, the groove section 113 is not filled by the junction metal raw material 140. Meanwhile, FIG. 9A is a top view in this process, and FIG. 9B shows a cross-sectional view cut along a dot-dashed line 9A-9B in FIG. 9A.

Figure 10A:
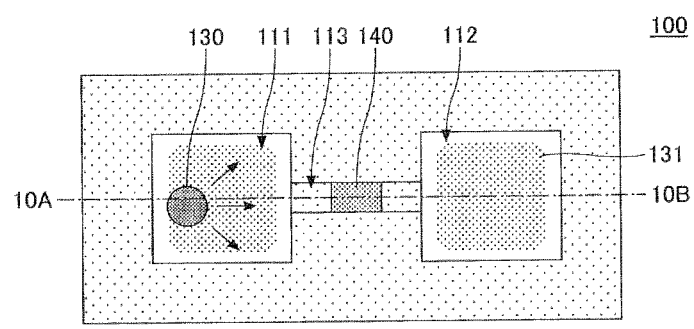
FIGS. 10A and 10B are sixth process diagrams illustrating an example of the manufacturing method of the alkali metal cell unit according to the first embodiment.
Figure 10B:
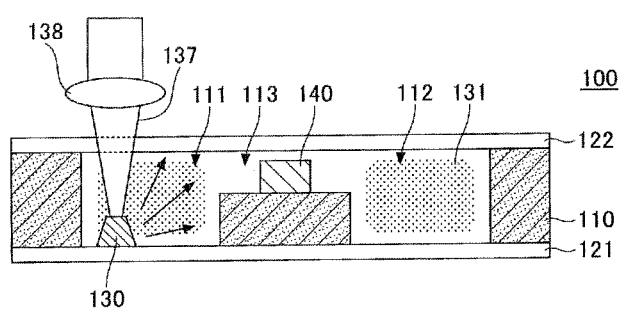

Next, as shown in FIGS. 10A and 10B, an alkali metal is generated from the alkali metal raw material 130. Meanwhile, FIG. 10A is a top view in this process, and FIG. 10B shows a cross-sectional view cut along a dot-dashed line 10A-10B in FIG. 10A. Specifically, the alkali metal raw material is, as a raw material, for example, in the case where the alkali metal is cesium Cs, a compound which is stable in the atmosphere including a Cs metal or Cs. For example, in the case of using a Cs dispenser, which is stable in the atmosphere, as the alkali metal raw material 130, after the Cs dispenser is injected in the first aperture 111 (raw material chamber) and sealed, a laser light 137 is focused by a lens 138, is emitted and heats to generate the Cs. The Cs generated inside the first aperture 111 (raw material chamber) has a melting point of about 28° C. When Cs is heated at a temperature higher than the melting point, Cs transforms to a mixed state of gas and liquid. The gaseous Cs, which is an alkali metal 131 in a gas state, spreads from the first aperture 111 (raw material chamber) to the second aperture 112 through the groove section 113.

Figure 11A:
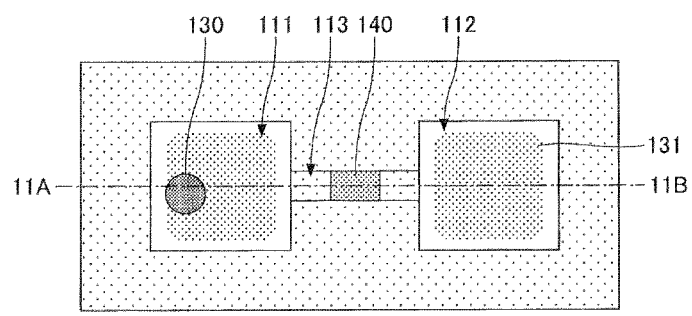
FIGS. 11A and 11B are seventh process diagrams illustrating an example of the manufacturing method of the alkali metal cell unit according to the first embodiment.
Figure 11B:
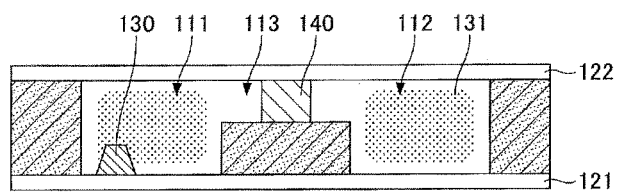

Next, as shown in FIGS. 11A and 11B, the junction metal raw material 140 placed in the groove section 113 of the Si substrate 110 is heated to a predetermined temperature and is melted, thereby the groove section 113 is filled. Accordingly, the first aperture 111 and the second aperture 112 are separated spatially, and the alkali metal 131 in a gas state is encapsulated inside the second aperture 112. In this way, an alkali metal encapsulation section is formed in the second aperture 112. Meanwhile, FIG. 11A is a top view in this process, and FIG. 11B shows a cross-sectional view cut along a dot-dashed line 11A-11B in FIG. 11A. After this, a gas cell unit is cut out by a dicing saw, and an alkali metal cell 100 is formed.

Figure 12:
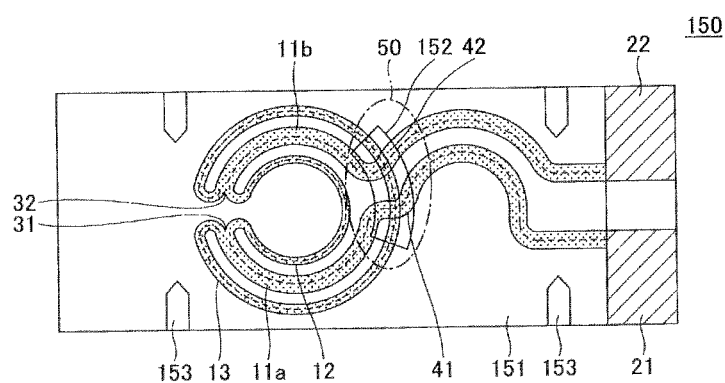
FIG. 12 is an eighth process diagram illustrating an example of the manufacturing method of the alkali metal cell unit according to the first embodiment.

Next, as shown in FIG. 12, a heater substrate 150, on which first heater wirings 11a, 11b, a second heater wiring 12, a third heater wiring 13 and the like are formed, is formed. The heater substrate 150 is formed by screen printing a conductive coating material which contains carbon as a major ingredient on a transparent substrate 151 having a thickness of about 125 µm, for example, a PET (polyethylene terephthalate) film substrate and sintering the coating material. According to the above processing, the first heater wirings 11a, 11b, the second heater wiring 12, the third heater wiring 13 and the like are formed on the transparent substrate 151, and the heater substrate 150 is formed. The first heater wirings 11a, 11b, the second heater wiring 12, the third heater wiring 13 and the like formed on the heater substrate 150 are formed in a region around the second aperture 112 when the alkali metal cell unit is fabricated.

Meanwhile, an insulation film 152 is formed at an intersection part 50 where a connection wiring 41 connecting the one first heater wiring 11a with a first electrode terminal 21, a connection wiring 42 connecting the other first heater wiring 11b with a second electrode terminal 22 and the third heater wiring 13 intersect. Specifically, the insulation film 152 is formed on the third heater wiring 13, and the connection wiring 41 and the connection wiring 42 are formed on the insulation film 152. The insulation film 152 is formed of, for example, an insulating resist or the like.

Explained in more detail, the PET film substrate as the transparent substrate 151 for forming the heater substrate 150, has a size with length of 13 mm and a width of 5 mm. In the heater substrate 150, the first heater wirings 11a, 11b, the second heater wiring 12 and the third heater wiring 13 are formed on one side of the transparent substrate 151. The first electrode terminal 21 is connected to one end of the one first heater wiring 11a via the connection wiring 41, and the second electrode terminal 22 is connected to one end of the other first heater wiring 11b via the connection wiring 42. Moreover, a first heater connection part 31 is provided at an other end of the one first heater wiring 11a, and one end of the second heater wiring 12 and one end of the third heater wiring 13 are connected to the first heater connection part 31. Moreover, a second heater connection part 32 is provided at an other end of the other first heater wiring 11b, and other end of the second heater wiring 12 and other end of the third heater wiring 13 are connected to the second heater connection part 32.

The heater substrate 150 is formed so that the wiring width of the first heater wirings 11a and 11b is 350 µm, the wiring width of the second heater wiring 12 is 175 µm, and the wiring width of the third heater wiring 13 is 225 µm. Moreover, an alignment marker 153 is provided on the heater substrate 150 so as to align easily when the heater substrate 150 is attached to the alkali metal cell 100. Meanwhile, in the heater substrate 150, on a side opposite to the side on which the first heater wirings 11a, 11b, the second heater wiring 12 and the third heater wiring 13 are provided, an adhesion layer which is not shown is formed and is attached to the alkali metal cell 100.

Figure 13A:
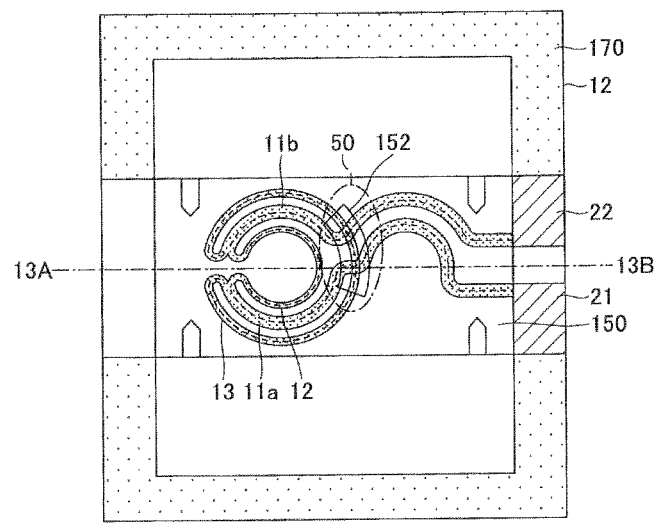
FIGS. 13A to 13C are ninth process diagrams illustrating an example of the manufacturing method of the alkali metal cell unit according to the first embodiment.
Figure 13B:
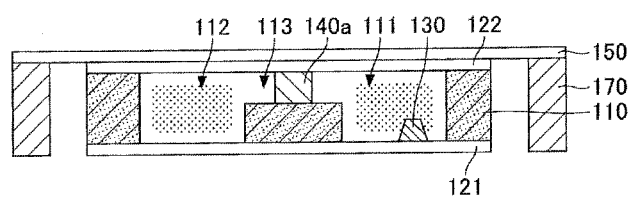
Figure 13C:
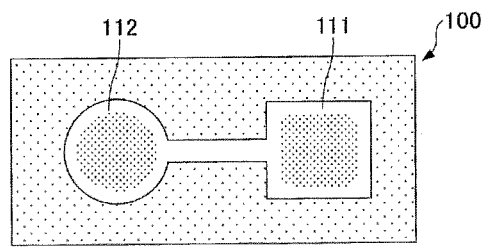

Next, as shown in FIGS. 13A to 13C, the heater substrate 150 is attached to the alkali metal cell 100. Specifically, a rear side of the heater substrate 150 is bonded to the alkali metal cell 100 having a size of 8 mm×5 mm. Furthermore, the heater substrate 150 is attached to a gas cell support member 170, which is fabricated by cutting an aluminum block, and the alkali metal cell unit is fabricated.

Meanwhile, in FIGS. 13A to 13C, as a matter of convenience, a case where a shape of the second aperture 112 is an approximate circular form is shown. Such a shape can be fabricated in the above-described manufacturing process by forming the shape of the second aperture 112 in an approximate circular form, not an approximate rectangular form. Moreover, in the alkali metal cell unit according to the present embodiment, the heater substrate 150 may be attached to the alkali metal cell 100 without attaching to the gas cell support member 170.

In the present embodiment, as described above, the PET film substrate is used for the transparent substrate 151 for forming the heater substrate 150. But, a glass substrate may be used. Moreover, the alkali metal cell 100 can be applied also to an alkali metal cell having a configuration that the first aperture 111 which will be the raw material chamber is separated.

According to the processes described above, the alkali metal cell unit in the present embodiment can be prepared.

Second Embodiment

Figure 14:
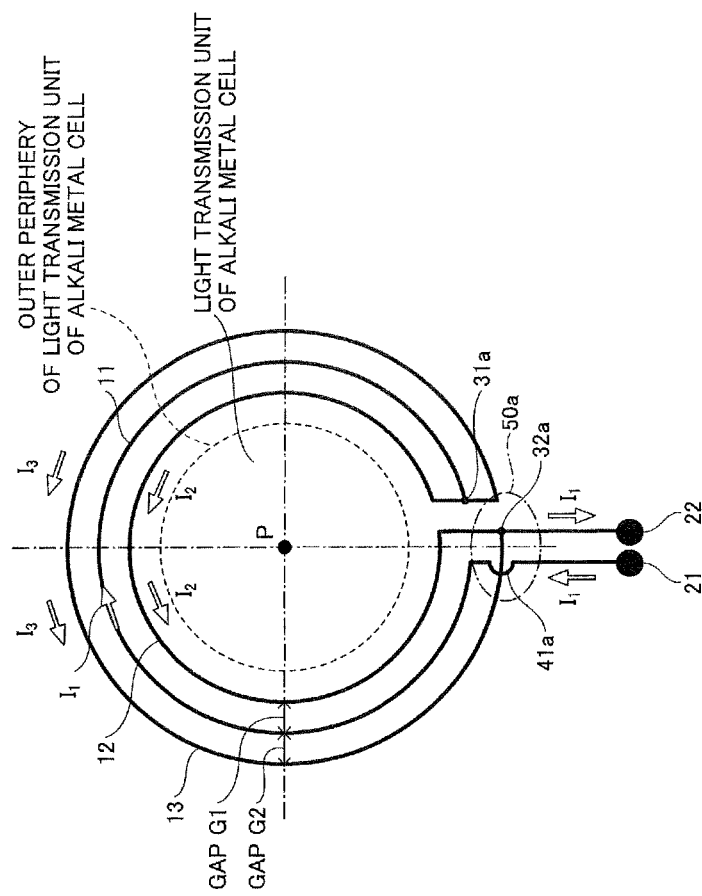
FIG. 14 is a configuration diagram illustrating an example of a heater in an alkali metal cell unit according to a second embodiment.

Next, a second embodiment of the present invention will be explained. In an alkali metal cell unit according to the present embodiment, a first heater wiring is not separated. Specifically, in the first embodiment, the first heater wiring has a configuration in which the one first heater wiring 11a and the other first heater wiring 11b are provided. However, the first heater wiring 11 can be a single heater wiring according to a configuration as shown in FIG. 14.

Specifically, a heater in the alkali metal cell unit according to the present embodiment has a configuration in which a second heater wiring 12 is arranged inside the first heater wiring 11 with a circular form, and a third heater wiring 13 is arranged outside the first heater wiring 11. One end of the first heater wiring 11 is connected to a first electrode terminal 21, and an other end of the first heater wiring 11 is connected to one end of the second heater wiring 12 and one end of the third heater wiring 13 via a first heater connection part 31a. An other end of the second heater wiring 12 and an other end of the third heater wiring 13 are connected to each other at a second heater connection part 32a, and are connected further to a second electrode terminal 22.

At an intersection part 50a where a connection wiring 41a to which the first heater wiring 11 and the first electrode terminal 21 are connected intersects with the third heater wiring 13, an insulation film which is not shown is provided on the third heater wiring 13. Accordingly, the connecting wiring 41a to which the first heater wiring 11 and the first electrode terminal 21 are connected is formed on the insulation film which is not shown provided on the third heater wiring 13.

Consider the case that in the heater provided in the alkali metal cell unit according to the present embodiment, the first electrode terminal 21 is connected to a positive terminal of the power supply, which is not shown, and the second electrode terminal 22 is connected to a negative terminal. In this case, an electric current $I_1$ flows through the first heater wiring 11 from the first electrode terminal 21 about a full round in the clockwise direction. At the first heater connection part 31a the electric current $I_1$ is divided into an electric current $I_2$ flowing in the second heater wiring 12 and an electric current $I_3$ flowing in the third heater wiring 13. In the second heater wiring 12 the electric current $I_2$ flows about a full round in the counterclockwise direction. In the third heater wiring 13 the electric current $I_3$ flows about a full round in the counterclockwise direction. At the second heater connection part 32a, the electric currents $I_2$ and $I_3$ are combined into the electric current $I_1$. The electric current $I_1$ flows to the second electrode terminal 22. Meanwhile, features other than the above are the same as in the first embodiment.

Third Embodiment

Figure 15:
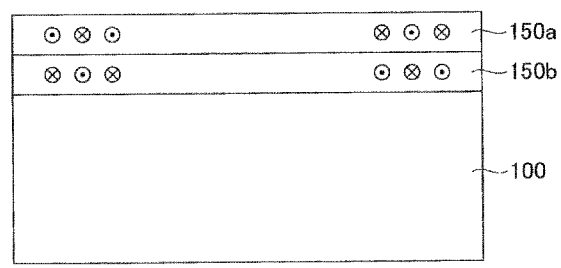
FIG. 15 is an explanatory diagram illustrating an example of an alkali metal cell unit according to a third embodiment.
Figure 16:
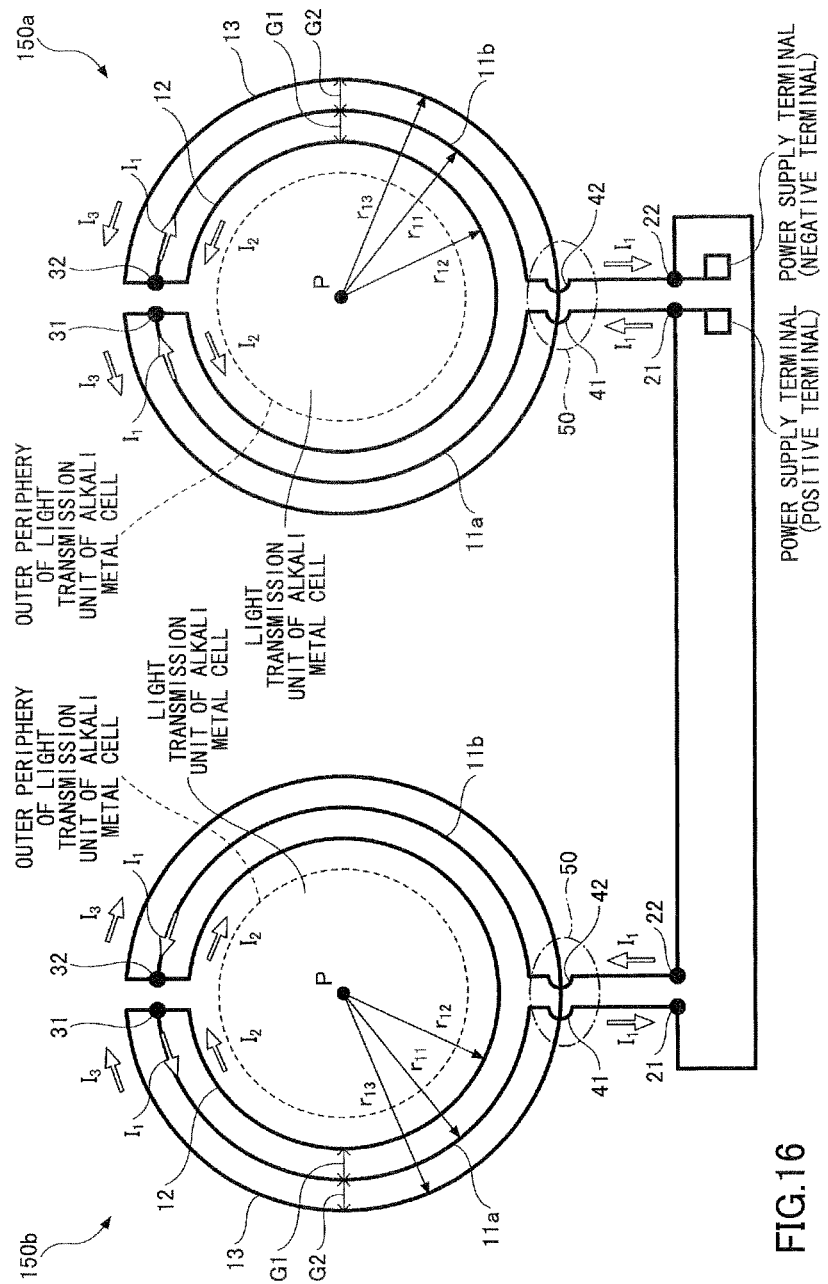
FIG. 16 is an explanatory diagram illustrating an example of a heater in the alkali metal cell unit according to the third embodiment.

Next, a third embodiment according to the present invention will be explained. An alkali metal cell unit according to the present embodiment has a configuration including two heater substrates, each of which is the same as the heater substrate shown in FIG. 4, that are laminated. The directions of the electric currents flowing in the respective heater substrates are opposite to each other. Specifically, as shown in FIGS. 15 and 16, the alkali metal cell unit has a configuration in which a second heater substrate 150b and a first heater substrate 150a are laminated in this order on one side of the alkali metal cell. Meanwhile, FIG. 16 shows, for the purpose of explanation, that the first heater substrate 150a and the second heater substrate 150b which are actually arranged vertically, are illustrated on a plane.

In the present embodiment, the directions of the electric currents are opposite to each other between the first heater substrate 150a and the second heater substrate 150b. That is, the first electrode terminal 21 in the first heater substrate 150a and the second electrode terminal 22 in the second heater substrate 150b are connected to the positive terminal of the power supply which is not shown. Moreover, the second electrode terminal 22 in the first heater substrate 150a and the first electrode terminal 21 in the second heater substrate 150b are connected to the negative terminal of the power supply which is not shown.

Specifically, in the first heater substrate 150a, the electric current flows from the first electrode terminal 21, through the one first heater wiring 11a, the second heater wiring 12 and the third heater wiring 13, and the other first heater wiring 11b, in this order, to the second electrode terminal 22. Moreover, in the second heater substrate 150b, the electric current flows from the second electrode terminal 22, through the other first heater wiring 11b, the second heater wiring 12 and the third heater wiring 13, and the one first heater wiring 11a, in this order, to the first electrode terminal 21. Therefore, the direction of the electric current flowing in the first heater substrate 150a is opposite to the direction of the electric current flowing in the second heater substrate 150b. Accordingly, in the case where the first heater substrate 150a and the second heater substrate 150b are laminated, as shown in FIG. 15, magnetic fields generated by the electric currents cancel each other also in the vertical direction, and the generation of the magnetic field can be further suppressed. Meanwhile, features other than the above are the same as in the first embodiment.

Fourth Embodiment

Figure 17:
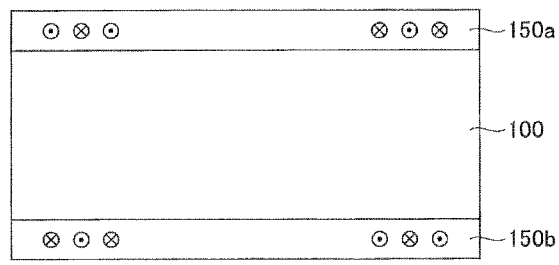
FIG. 17 is an explanatory diagram illustrating an example of an alkali metal cell unit according to a fourth embodiment.

Next, a fourth embodiment according to the present invention will be explained. An alkali metal cell unit according to the present embodiment has a configuration in which two heater substrates each of which is the same as the heater substrate shown in FIG. 4 are provided, and are arranged on opposing sides of the alkali metal cell 100, respectively. The directions of the electric currents flowing in the respective heater substrates are opposite to each other. Specifically, as shown in FIG. 17, the alkali metal cell unit has a configuration in which a first heater substrate 150a is arranged on one side of the alkali metal cell 100, and a second heater substrate 150b is arranged on an other side of the alkali metal cell 100. In the present embodiment, the directions of the electric currents are opposite to each other between the first heater substrate 150a and the second heater substrate 150b. Also in the alkali metal cell unit having such a configuration as described above, in the same way as in the third embodiment, magnetic fields generated by the electric currents cancel each other also in the vertical direction, and the generation of the magnetic field can be further suppressed. Meanwhile, features other than the above are the same as in the third embodiment.

Fifth Embodiment

Figure 18:
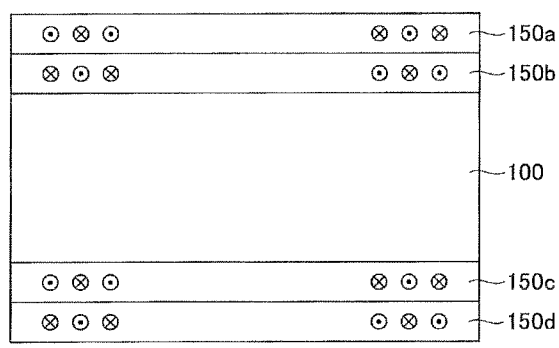
FIG. 18 is an explanatory diagram illustrating an example of an alkali metal cell unit according to a fifth embodiment.
Figure 19:
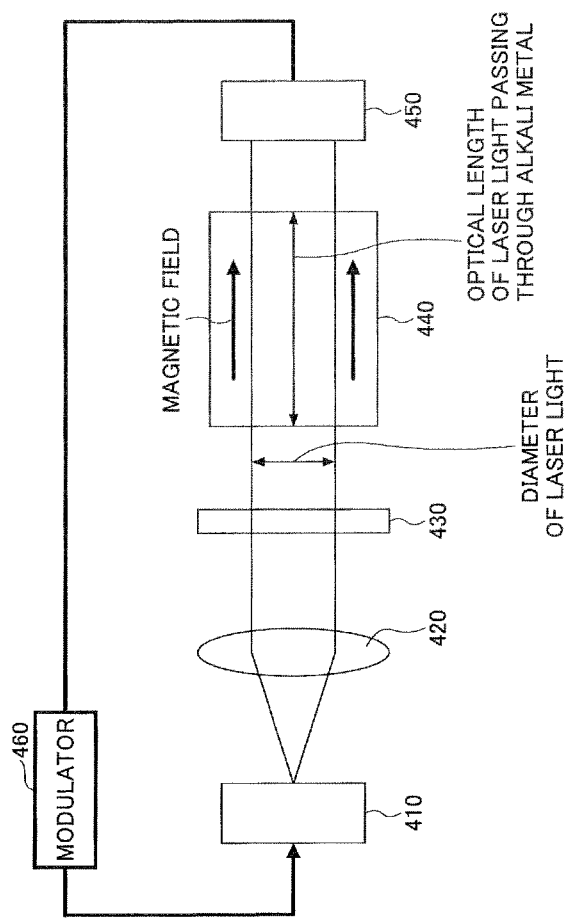
FIG. 19 is an explanatory diagram illustrating an example of an atomic oscillator according to a sixth embodiment.

Next, a fifth embodiment according to the present invention will be explained. An alkali metal cell unit according to the present embodiment has a configuration in which four heater substrates each of which is the same as the heater substrate shown in FIG. 4 are provided, and two heater substrates are arranged on each of opposing sides of the alkali metal cell 100. The directions of the electric currents flowing in the respective heater substrates arranged on each side of the alkali metal cell 100 are opposite to each other. That is, as shown in FIG. 18, the alkali metal cell unit has a configuration in which a pair of laminated heater substrates like the first heater substrate 150a and the second heater substrate 150b in the third embodiment, is arranged on each side of the alkali metal cell 100.

Specifically, on one side of the alkali metal cell 100, laminated heater substrates including a first heater substrate 150a and a second heater substrate 150b are arranged, and on an other side of the alkali metal cell 100, laminated heater substrates including a third heater substrate 150c and a fourth heater substrate 150d are arranged. In the present embodiment, the directions of the electric currents are opposite to each other between the first heater substrate 150a and the second heater substrate 150, and the directions of the electric currents are opposite to each other between the third heater substrate 150c and the fourth hearer substrate 150d.

Explained in more detail, in the third heater substrate 150c, the electric currents flow in the same way as in the first heater substrate 150a. In the fourth heater substrate 150d, the electric currents flow in the same way as in the second heater substrate 150b. Therefore, the direction of the electric current flowing in the third heater substrate 150c is opposite to the direction of the electric current flowing in the fourth heater substrate 150d. Accordingly, in the case where the third heater substrate 150c and the fourth heater substrate 150d are laminated, as shown in FIG. 18, magnetic fields generated by the electric currents cancel each other also in the vertical direction. Moreover, as described above, the direction of the electric current flowing in the first heater substrate 150a is opposite to the direction of the electric current flowing in the second heater substrate 150b. Accordingly, in the case where the first heater substrate 150a and the second heater substrate 150b are laminated, magnetic fields generated by the electric currents cancel each other also in the vertical direction. Therefore, the generation of the magnetic field can be further suppressed. Meanwhile, features other than the above are the same as in the third embodiment.

Sixth Embodiment

Next, a sixth embodiment according to the present invention will be explained. The present embodiment relates to an atomic oscillator using the alkali metal cell according to any one of the first to fifth embodiments. With reference to FIG.

19, the atomic oscillator according to the present embodiment will be explained. The atomic oscillator according to the present embodiment is a small-sized CPT-type atomic oscillator, including a light source 410, a collimator lens 420, a λ/4 plate 430, an alkali metal cell 440, a light detector 450 and a modulator 460. In the atomic oscillator, by injecting lights with two different wavelengths of light emitted from the light source 410 including sidebands into the alkali metal cell 440, an oscillation frequency is controlled according to a light absorption characteristic of a quantum interference effect for two kinds of resonant lights.

For the light source 410, a surface emitting laser element is used. In the alkali metal cell 440, gas of cesium (Cs) atoms is encapsulated, and a $D_1$ line transition is used. For the light detector 450, a photo diode is used.

In the atomic oscillator according to the present embodiment, light emitted from the light source 410 is transmitted onto the alkali metal cell 440 in which the gas of cesium atoms are encapsulated, and excites electrons in the cesium atoms. Light which passes through the alkali metal cell 440 is detected by the light detector 450. A signal detected by the light detector 450 is fed back to the modulator 460. The surface emitting laser element in the light source 410 is modulated by the modulator 460.

Figure 20:
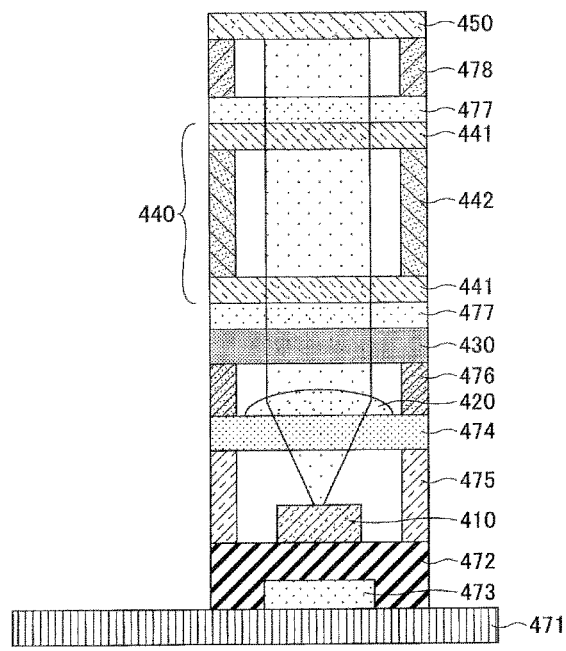
FIG. 20 is a configuration diagram illustrating an example of the atomic oscillator according to the sixth embodiment.

With reference to FIG. 20, the atomic oscillator according to the present embodiment will be explained. The atomic oscillator according to the present embodiment is formed in a longitudinal direction on a circuit substrate 471. On the circuit substrate 471 an alumina substrate 472 is provided, and on the alumna substrate 472 a surface emitting laser element which will be a light source 410 is arranged. Meanwhile, on the alumina substrate 472, a heater for surface emitting laser 473 is arranged for controlling a temperature or the like of the light source 410. Above the light source 410, a Neutral Density (ND) filter 474 is provided. The ND filter 474 is arranged at a predetermined position by a heat-insulating spacer 475 formed of glass or the like. In an upper part of the ND filter 474, a collimator lens 420 is provided, and above the collimator lens 420 a λ/4 plate 430 is provided. The λ/4 plate 430 is arranged at a predetermined position by a spacer 476 formed of silicon or the like. On the λ/4 plate 430, an alkali metal cell 440 is provided. The alkali metal cell 440 includes two glass substrates 441, and an edge part is connected by a silicon substrate 442 in a state where the two glass substrates 441 face each other. In a part enclosed by the glass substrates 441 and the silicon substrate 442 an alkali metal is encapsulated. Meanwhile, in the alkali metal cell 440, surfaces through which laser light transmits are formed by the glass substrates 441. On both sides of the alkali metal cell 440, heaters for cell 477 are provided, and the alkali metal cell 440 can be set at a predetermined temperature. Above the alkali metal cell 440, a light detector 450 is provided. The light detector 450 is arrange at a predetermined position by a spacer 478 formed of silicon.

Figure 21:
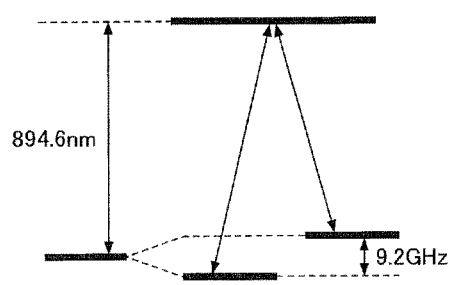
FIG. 21 is an explanatory diagram illustrating an example of an atomic energy level for explaining a CPT type.
Figure 22:
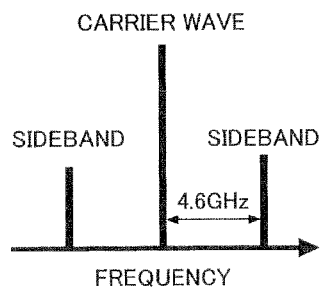
FIG. 22 is an explanatory diagram illustrating an example of an output wavelength on a modulation of a surface emitting laser.
Figure 23:
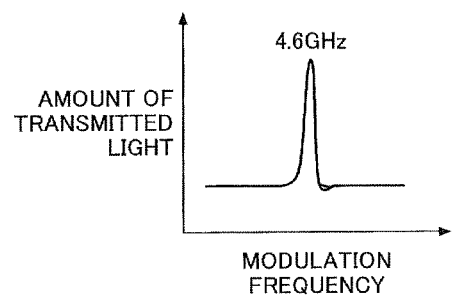
FIG. 23 is a correlation diagram illustrating an example of a correlation between a modulation frequency and an amount of transmitted light.

Next, a structure of atomic energy levels related to the CPT (Coherent Population Trapping) is shown in FIG. 21. The CPT uses a phenomenon that when electrons are excited from two ground levels to an excited level simultaneously, an absorption rate of light decreases. For the surface emitting laser element, an element emitting a carrier wave with a wavelength close to 894.6 nm is used. The wavelength of the carrier wave can be tuned by changing a temperature at or an output from the surface emitting laser element. As shown in FIG. 22, modulation sidebands are generated on both sides of the carrier wave. The carrier wave is modulated at 4.6 GHz, so that the frequency difference corresponds to the eigen frequency of the cesium (Cs) atoms, i.e. 9.2 GHz. As shown in FIG. 23, an amount of transmitted laser light through a gas of the excited Cs atoms reaches a maximum when the frequency difference of the sidebands corresponds to a difference of the eigen frequency of the Cs atoms. Accordingly, the modulation frequency for the surface emitting laser element in the light source 410 is adjusted by the feedback at the modulator 460 so that an output from the light detector 450 maintains the maximum value. Since the eigen frequency of an atom is quite stable, the modulation frequency takes a stable value, and this information is extracted as an output. Meanwhile, in the case of the wavelength of 894.6 nm, a wavelength adjustment in a range of ±1 nm is necessary.

Meanwhile, in the atomic oscillator according to the present embodiment, for the alkali metal cell 440, any of the alkali metal cells according to the first to fifth embodiments is used. Moreover, in the alkali metal cell 440 of the atomic oscillator according to the present embodiment, the silicon substrate 442 corresponds to the Si substrate 110 in the first embodiment or the like. The glass substrates 441 correspond to the first glass substrate 121 and the second glass substrate 122 in the first embodiment or the like. The heaters for cell 477 correspond to the heater substrate 150 or the like.

Moreover, in the present embodiment, for the alkali metal, cesium (Cs) is used, and the surface emitting laser element emits laser light with the wavelength of 894.6 nm so as to use transitions from the $D_1$ lines. In the case of using the $D_2$ lines of Cs, laser light with a wavelength of 852.3 nm may be used. Moreover, for the alkali metal, rubidium (Rb) may be used. In the case of using the $D_1$ lines of Rb, a wavelength of the laser light is 795.0 nm, and in the case of using the $D_2$ lines of Rb, a wavelength of the laser light is 780.2 nm. Moreover, in the case of using Rb, the modulation frequency is 3.4 GHz for $^{87}$Rb and 1.5 GHz for $^{85}$Rb. Meanwhile, also in the above wavelengths, a wavelength adjustment in a range of ±1 nm is necessary.

Further, the present invention is not limited to these embodiments, but various variations and modifications may be made without departing from the scope of the present invention.

The present application is based on and claims the benefit of priority of Japanese Priority Applications No. 2013-170552 filed on Aug. 20, 2013, and No. 2014-121562 filed on Jun. 12, 2014, the entire contents of which are hereby incorporated by reference.

What is claimed is:

1. A heater substrate for heating an alkali metal cell including an alkali metal comprising:
   a first heater wiring formed in a region surrounding an alkali metal encapsulating part in which the alkali metal is encapsulated;
   a second heater wiring formed in the region surrounding the alkali metal encapsulating part and inside the first heater wiring; and
   a third heater wiring formed outside the first heater wiring, wherein
   an electric current flowing in the first heater wiring is divided into an electric current flowing in the second heater wiring and an electric current flowing in the third heater wiring, and
   a direction of the electric current flowing in the first heater wiring is opposite to a direction of the electric current flowing in the second heater wiring and a direction of the electric current flowing in the third heater wiring.

2. The heater substrate as claimed in claim 1, wherein the electric current flowing in the second heater wiring is less than the electric current flowing in the first heater wiring.

3. An alkali metal cell unit including the heater substrate as claimed in claim 1 and the alkali metal cell, wherein
the alkali metal cell includes:
a substrate in which an aperture penetrating from a first side to a second side is formed;
a first transparent substrate bonded to the first side of the substrate; and
a second transparent substrate bonded to the second side of the substrate, wherein
the alkali metal is encapsulated in a space enclosed by the first transparent substrate and the second transparent substrate in the aperture of the substrate, to form the alkali metal encapsulating part, and
the heater substrate is provided on the first transparent substrate or on the second transparent substrate.

4. The alkali metal cell unit as claimed in claim 3, further comprising an other heater substrate, wherein
the heater substrate is provided on the first transparent substrate or on the second transparent substrate,
the other heater substrate is provided on the heater substrate, and
a direction of the electric current in the heater substrate is opposite to a direction of the electric current in the other heater substrate.

5. The alkali metal cell unit as claimed in claim 3, further comprising other heater substrate, wherein
the heater substrate is provided on the first transparent substrate, and
the other heater substrate is provided on the second transparent substrate.

6. The alkali metal cell unit as claimed in claim 3, wherein
a distance between a center of the first heater wiring and a center of the second heater wiring is the same as a distance between the center of the first heater wiring and a center of the third heater wiring, and
the electric current flowing in the second heater wiring is less than the electric current flowing in the third heater wiring.

7. The alkali metal cell unit as claimed in claim 6, wherein
a wiring width of the second heater wiring is less than a wiring width of the third heater wiring.

8. The alkali metal cell unit as claimed in claim 3, wherein
a distance between a center of the first heater wiring and a center of the second heater wiring is greater than a distance between the center of the first heater wiring and a center of the third heater wiring.

9. The alkali metal cell unit as claimed in claim 3, further comprising a gas cell support member that encompasses the substrate, the first transparent substrate and the second transparent substrate, wherein
the heater substrate contacts the gas cell support member.

10. An atomic oscillator comprising:
the alkali metal cell unit as claimed in claim 3;
a light source that emits laser light on the alkali metal encapsulating part in the alkali metal cell unit; and
a light detection unit that detects light transmitted through the alkali metal encapsulating part in the alkali metal cell unit of the laser light emitted on the alkali metal encapsulating part in the alkali metal cell unit.

* * * * *